US 6,690,254 B2

(12) United States Patent
McGrane et al.

(10) Patent No.: US 6,690,254 B2
(45) Date of Patent: Feb. 10, 2004

(54) HOUSING FOR AN ELECTRONIC COMPONENT

(75) Inventors: Kevin McGrane, Suffolk (GB); Timothy John Morris, Ipswich (GB)

(73) Assignee: Profec Technologies Limited (GB)

( * ) Notice: Subject to any disclaimer, the term of this patent is extended or adjusted under 35 U.S.C. 154(b) by 54 days.

(21) Appl. No.: 10/038,173

(22) Filed: Jan. 2, 2002

(65) Prior Publication Data

US 2002/0057163 A1 May 16, 2002

Related U.S. Application Data

(62) Division of application No. 09/701,529, filed on Nov. 28, 2000, now Pat. No. 6,344,787.

(30) Foreign Application Priority Data

May 29, 1998 (GB) .............................................. 9811447

(51) Int. Cl.⁷ .......................... H01F 27/02; H01F 27/30
(52) U.S. Cl. ......................................... 336/90; 336/198
(58) Field of Search ............................ 336/198, 82, 83, 336/90

(56) References Cited

U.S. PATENT DOCUMENTS

| | | | | |
|---|---|---|---|---|
| 4,029,896 A | * | 6/1977 | Skinner ................. | 174/138 F |
| 4,049,357 A | * | 9/1977 | Hamisch, Jr. ............... | 403/209 |
| 4,238,753 A | | 12/1980 | Bayer .......................... | 336/178 |
| 4,885,559 A | | 12/1989 | Nakano ........................ | 336/92 |
| 4,949,221 A | | 8/1990 | Rollins et al. .............. | 361/400 |
| 5,363,079 A | * | 11/1994 | Zawada et al. ............... | 336/92 |
| 5,751,204 A | * | 5/1998 | Chen ........................... | 336/98 |
| 5,815,061 A | | 9/1998 | Ho .............................. | 336/192 |
| 6,204,743 B1 | * | 3/2001 | Greenberg et al. .......... | 335/172 |

FOREIGN PATENT DOCUMENTS

| | | | |
|---|---|---|---|
| EP | 0070752 | 1/1983 | .................... 27/32 |
| EP | 357237 | 3/1990 | ........................ 5/4 |
| EP | 615260 | 3/1994 | ..................... 15/2 |
| GB | 2129622 A | * 5/1984 | |
| GB | 2230148 | 10/1990 | .................... 27/24 |
| GB | 2280990 | 2/1995 | ..................... 27/2 |
| JP | 61114510 | 6/1986 | .................... 27/32 |

* cited by examiner

*Primary Examiner*—Anh Mai
(74) *Attorney, Agent, or Firm*—Bourque & Associates P.A.

(57) ABSTRACT

A housing for an electronic component has a set of walls for surrounding the component. The component is snap-fitted into the housing to retain it in the housing through snap-fit features in the housing and snap-fit features on the component. The housing can incorporate springs which, in use, bias the component into contact with the snap-fit features. If the component is a transformer, the springs can act on the transformer laminations to press the stack of laminations together while biasing the component into contact with the snap-fit features.

16 Claims, 7 Drawing Sheets

HOUSING FOR AN ELECTRONIC COMPONENT

RELATED APPLICATION

This application is a divisional of U.S. patent application Ser. No. 09/701,529 which was filed Nov. 28, 2000 now U.S. Pat. No. 6,344,787, which is the National Stage of PCT/GB99/01687, filed May 27, 1999.

FIELD OF THE INVENTION

This invention relates to a housing for an electronic component such as a signal transformer.

BACKGROUND OF THE INVENTION

Electronic components are often mounted in housings before being assembled with other components on a circuit board. Usually the space between the component and the internal walls of the housing (and any internal space within the component) is filled with a resin to encapsulate the component. Mounting the component within a housing ensures that the component is electrically isolated from adjacent components on the circuit board, protects the component from damage and eases handling and assembly of the component.

SUMMARY OF THE INVENTION

According to the invention, there is provided a housing for an electronic component, the housing having a set of walls for surrounding the component, an open base through which the component can be introduced into the housing and through which component terminals can be exposed to allow the component to be mounted on a circuit board, snap-fit features past which the component can snap to retain the component in the housing and internal springs which, in use, bias the component into contact with the snap-fit features.

This type of construction has many benefits when compared with the conventional 'potting' or 'encapsulation' processes. Assembly of the component into the housing now requires only one mechanical action and can provide electrical insulation and isolation for the component. Because there is no encapsulating compound surrounding the component, disassembly and recycling of the materials from which the component is made is easily possible.

The housing is preferably parallelepipedic in form and has five walls, an open face through which the component can be introduced, and openings at or near the apexes of the housing. This is the conventional shape for component housings and allows them to be easily handled and oriented.

The snap-fit features may comprise a set of resilient lugs moulded as part of the housing and past which the component can snap to hold the component in the housing. Alternatively, the housing can have a set of apertures or recesses into which features on the component can locate with a snap-fit action.

Furthermore, the internal springs which, in use, bias the component into contact with the snap-fit features prevent any rattling or looseness. The housing can be of moulded plastics with the springs moulded as integral parts of the housing.

The housing preferably has side walls, and at least part of the lower edge of at least part of the side walls is cut-away relative to at least other parts of the side walls, so that the parts which are not cut-away form feet which contact a substrate when the housing is in use and the cut away parts allow a fluid flow path into and out of the housing. The housing may also have apertures in its walls to allow a fluid flow path into and out of the housing. These apertures can be at the corners of a parallelepipedic housing.

The top wall of the housing is preferably flat and can serve as a surface for carrying a manufacturer's mark and/or as a surface which can be contacted by vacuum handling equipment.

The invention extends to the combination of an electronic component and a housing therefor, the housing having a set of walls for surrounding the component, an open base through which the component can be introduced into the housing, both the housing and the component having snap-fit features with the snap-fit features of the housing and of the component being arranged to be snap-fitted together to retain the component in the housing so that component terminals are exposed through the open base to allow the component to be mounted on a circuit board, the housing having internal springs which, in use, bias the snap-fit features into contact to prevent play between the component and the housing.

The component can be a transformer with a housing, a bobbin, coils wound on the bobbin and core laminations fitted on the bobbin. The bobbin includes snap-fit features adapted to engage with snap-fit features in the housing, and the housing includes integral springs which press the laminations against one another in a stack when the transformer is fitted in the housing and bias the bobbin into contact with the snap-fit features.

In this case, the size and position of the openings through the housing walls is such as not to compromise the required creepage and clearance requirements and the thickness of the housing walls is sufficient to meet the solid insulation requirements of the transformer.

The transformer laminations will be stacked one on the other in the bobbin and the springs in the housing will press the laminations against one another to ensure good magnetic performance, with the spring force being transmitted through the laminations to the bobbin to press the snap-fit features on the bobbin against the snap-fit features in the housing. The laminations are not directly secured together or to the bobbin, but are prevented from being displaced after assembly by the proximity of the walls of the housing.

According to another aspect of the invention, there is provided a transformer having a housing, a bobbin, coils wound on the bobbin and core laminations fitted within the bobbin, wherein the bobbin is a plastics moulding which includes snap-fit features adapted to engage with snap-fit features in the housing, and the housing includes integral springs which press the laminations against one another in a stack when the transformer is fitted in the housing.

When the component is a transformer as described here, there are significant recycling advantages. The plastics housing can be detached to remove the transformer. The laminations can be extracted, as they are only held in position by the housing, and the copper wire can be unwound from the bobbin. The plastics bobbin and housing can be recycled using conventional plastics recycling techniques (and it does not matter if the snap-fit features are damaged during disassembly, as recycling will normally involve remelting the plastics); the copper wire can be recycled after remelting and the laminations can be reused without any further treatment. The material of the laminations is expensive, and this recycling can be worthwhile if only to recover and reuse the laminations. None of this would be feasible with an encapsulated or varnish impregnated component which would have to be disposed of in landfill.

BRIEF DESCRIPTION OF THE DRAWINGS

The invention will now be further described, by way of example, with reference to the accompanying drawings in which.

DETAILED DESCRIPTION OF THE PREFERRED EMBODIMENTS

Figure 1:
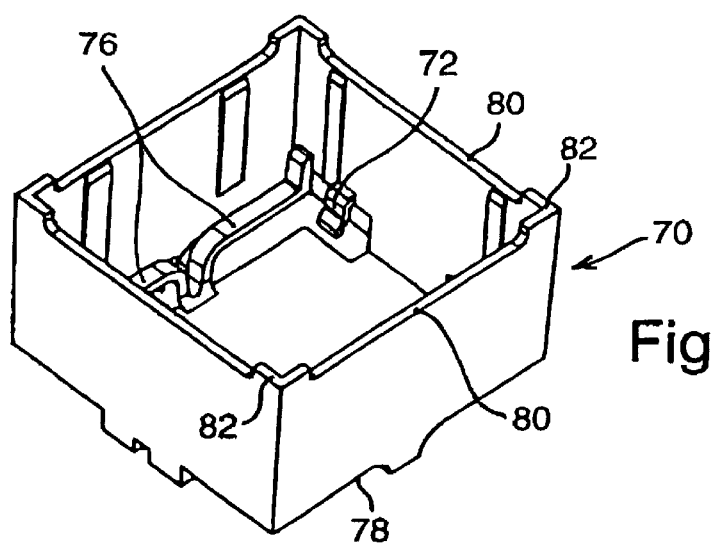
FIG. 1 is an underneath view of a transformer housing in accordance with the invention.

A housing 70, FIG. 1, is in the form of a moulded five-sided box. The box can be moulded with a multi-impression simple open-shut tool without slides.

Figure 3:
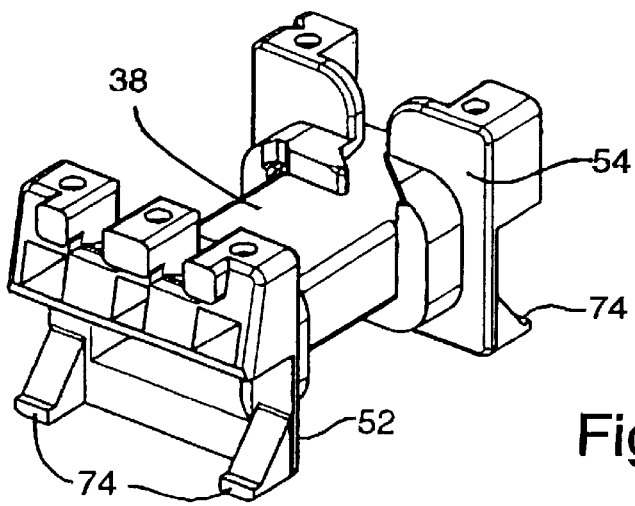
FIG. 3 shows a transformer bobbin adapted for use with the housing of FIGS. 1 and 2.
Figure 4:
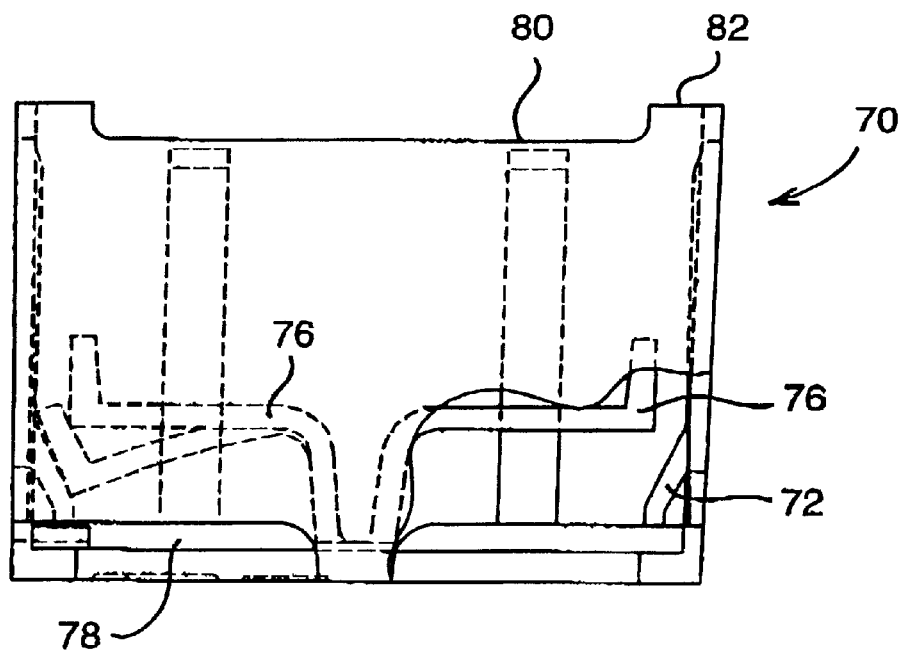
FIG. 4 is a side view illustrating springs which control interlamination pressure in a transformer.

In FIG. 1, we are looking in from underneath. Inside the box can be seen snap-fit features in the form of lugs 72 (there are four of these in this embodiment) into which appropriately positioned snap-fit features in the form of feet 74 of the bobbin (FIG. 3) will locate. The bobbin is shown 'naked' in FIG. 3, but will be wound and provided with laminations before being snapped into the lugs 72.

Also inside the box are four moulded springs 76 (two are visible in FIG. 1). These springs are moulded from the same material as walls of the housing, and act to provide the necessary interlamination pressure, as will be described below.

The box has open corners 78 (see particularly FIGS. 2 and 5) which allow any liquid penetrating inside the box to drain away and air to circulate. As the transformer to be housed inside the box is not encapsulated, it is important that any rinsing fluid be allowed to escape if rinsing of the circuit board has to take place after the components have been mounted. The bottom edges of the box also have cut-away portions 80 between the corners 82 to allow drainage.

Finally, the top of the box has a flat area 84 which can receive component identification information and manufacturer's trade marks.

A transformer constructed as described in our British Patent 2 333 646 has no need of encapsulation which is sometimes required to meet the isolation requirements specified by international standards. It is desirable to avoid the need for encapsulation because this adds costs and production time and degrades signal distortion performance.

Because of the efficiency advantages obtained with this construction, some transformers may need less magnetic material in their core than would have been the case with prior art transformers. This can be achieved by using less laminations 32. The laminations which together make up the magnetic core of the transformer have to be lightly pressed together to perform their function. FIGS. 1 to 5 show how this can be achieved, using a moulded housing which also gives other benefits to the completed construction.

Figure 2:
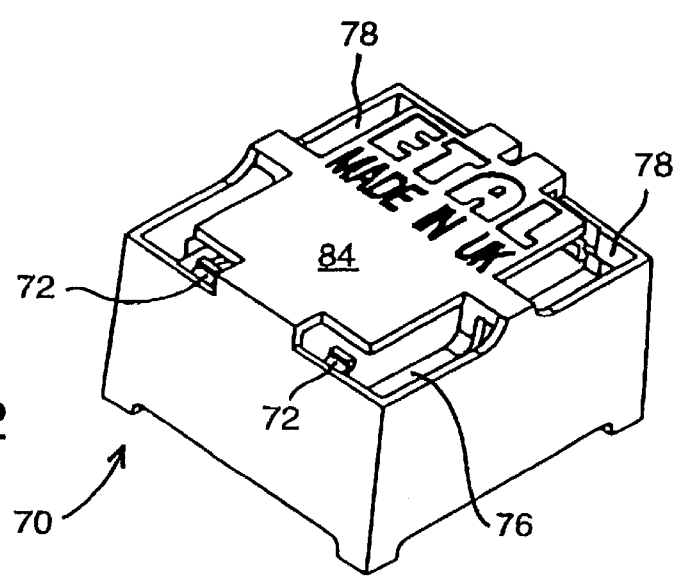
FIG. 2 is a top view of the housing of FIG. 10.
Figure 5:
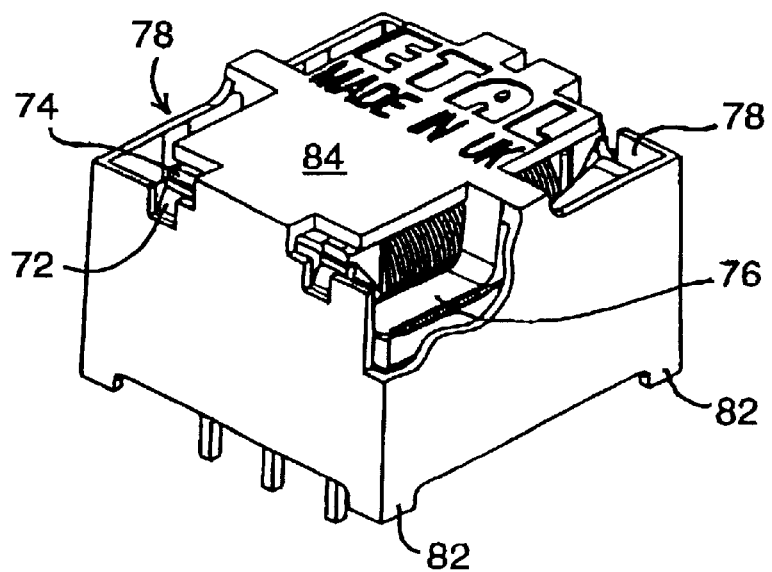
FIG. 5 shows a completed, housed transformer.

FIG. 5 shows the box walls cut away in the area of the lugs 72. It is preferred to have these lugs located behind a continuous area of wall, as shown in FIGS. 1 and 2, to ensure that the correct creepage/clearance dimensions are maintained by the walls of the box.

The box walls are of electrically insulating material, preferably at least 0.4 mm thick, so that the box provides solid insulation and sufficiently long creepage and clearance paths through the open portions to insulate the transformer from other adjacent components and from any close surfaces of a housing in which the circuit incorporating the transformer is housed.

As mentioned earlier, the efficiencies resulting from the transformer design described here allow a smaller number of laminations 32 to be used to achieve the desired transformer performance. It will be seen from FIG. 2 that the central core of the bobbin is designed to receive a specific number of laminations, making up a stack of a certain height. If a lesser number of laminations is used, there needs to be some way in which they can be lightly pressed together to achieve optimum performance.

This can be achieved by the moulded springs 76 in the box 70. When the completed transformer is fitted into the box, the external limbs 77 of the laminations 32 will lie against the springs 76. When the transformer is pushed home into the box, so that the feet 74 snap into the lugs 72, the springs 76 will be depressed, as shown in the left-hand part of FIG. 4. This will provide a force on the laminations pressing them lightly against one another, and the form, length and position of the springs will be designed to provide this force, whether the transformer has a full stack of laminations, or has less than a full stack.

The springs will also ensure that pressure is kept on the lug/foot joints 72, 74 thus producing a rattle-free assembly.

In the particular design of snap-fit shown, the effect of the springs (or of an external force attempting to pull the box and transformer apart) merely forces the lugs 72 more closely into contact with the transformer bobbin, ie it is a locking fit. With excessive force, the lugs 72 will shear off parallel to the side walls, rather than bending back to release the bobbin, so that assembly can only be disassembled destructively (or with a special tool).

In FIGS. 6 to 10, the basic form of the housing is similar to that shown in FIGS. 1, 2, 4 and 5. The same reference numerals are used for the same features. These figures show various different ways in which the function of the springs 76 can be provided.

Figure 6A:
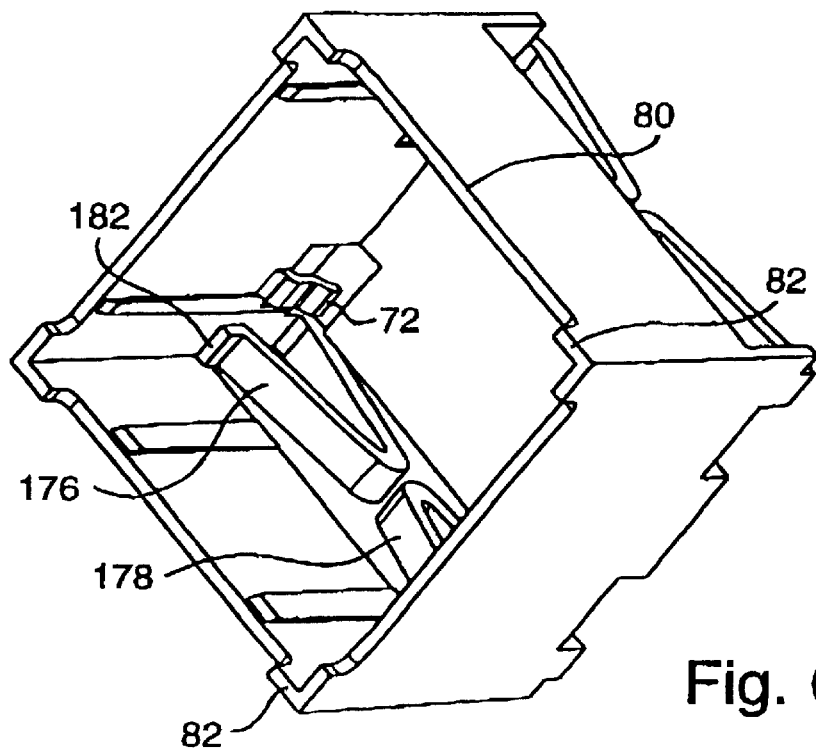
FIGS. 6 to 10 show housings in accordance with the invention with different spring arrangements.
Figure 6B:
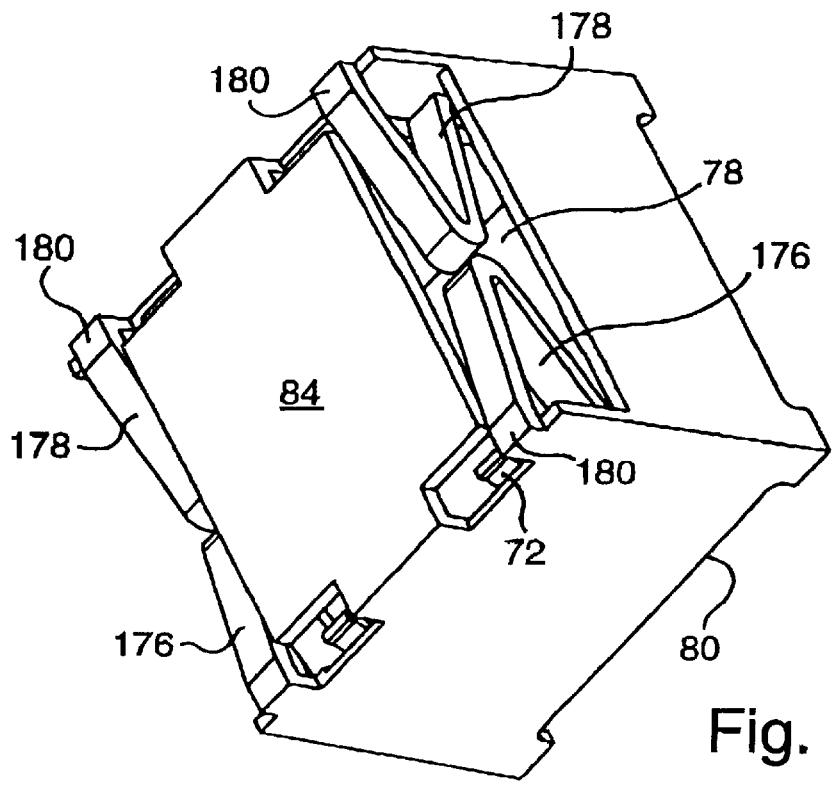

FIGS. 6a and 6b show a housing with, on each side, two independent spring arms 176, 178. These arms are each in a V-shape with one of the ends 180 of each arm moulded integrally with the walls of the housing and the other end 182 being free. The free end 182 will press against the stack of laminations. The top of the housing is cut-away across the top of the springs as can be seen in FIG. 6b.

Figure 7A:
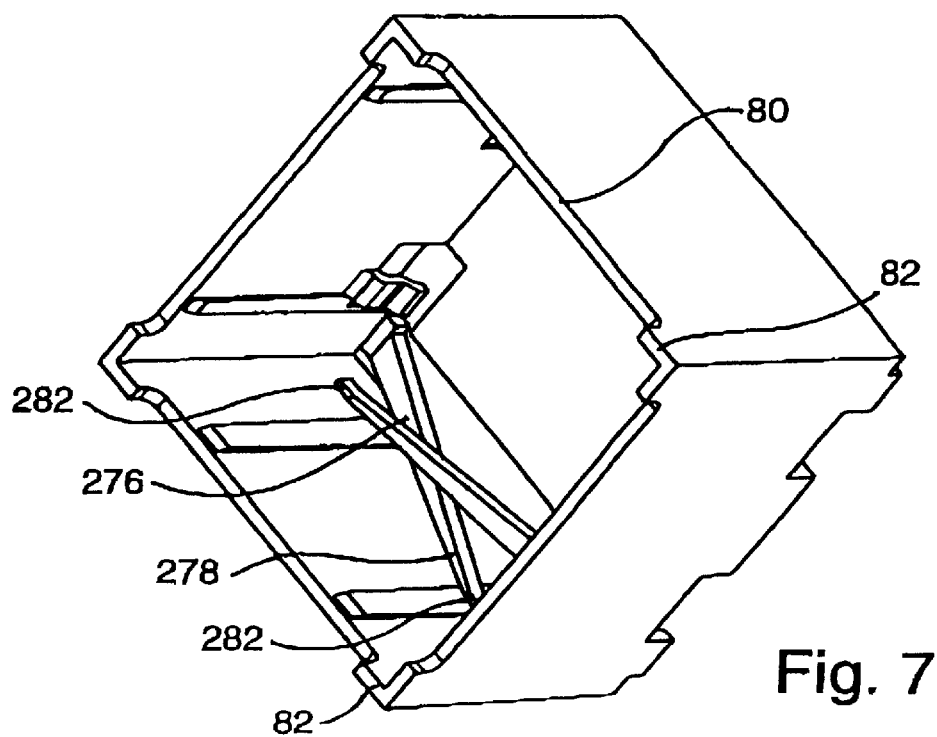
Figure 7B:
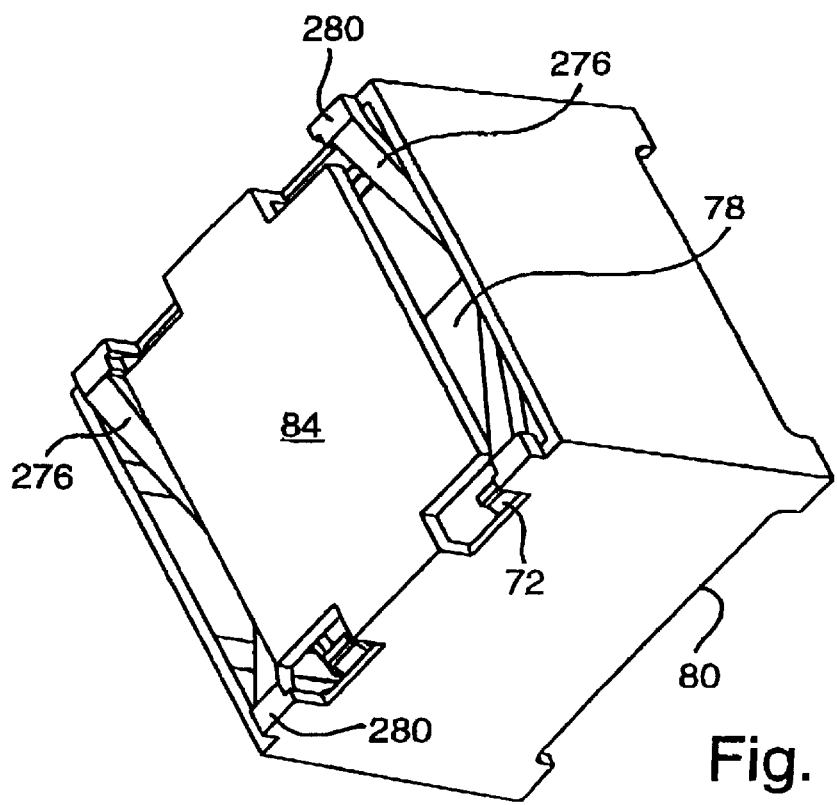

FIGS. 7a and 7b show a housing with, on each side, two independent spring arms 276, 278. These arms cross over, have one end 280 moulded integrally with the walls of the housing and extend towards the opposite side of the housing so that their free ends 282 are on the opposite side of the middle of the housing than their fixed ends. The top of the housing is cut-away across the top of the springs as can be seen in FIG. 7b.

Figure 8A:
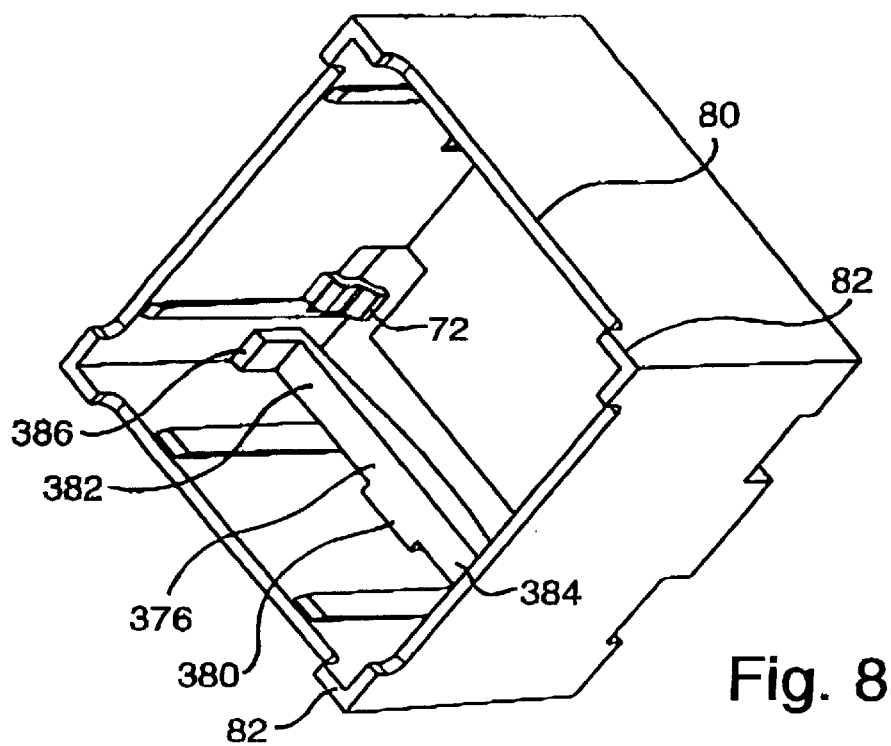
Figure 8B:
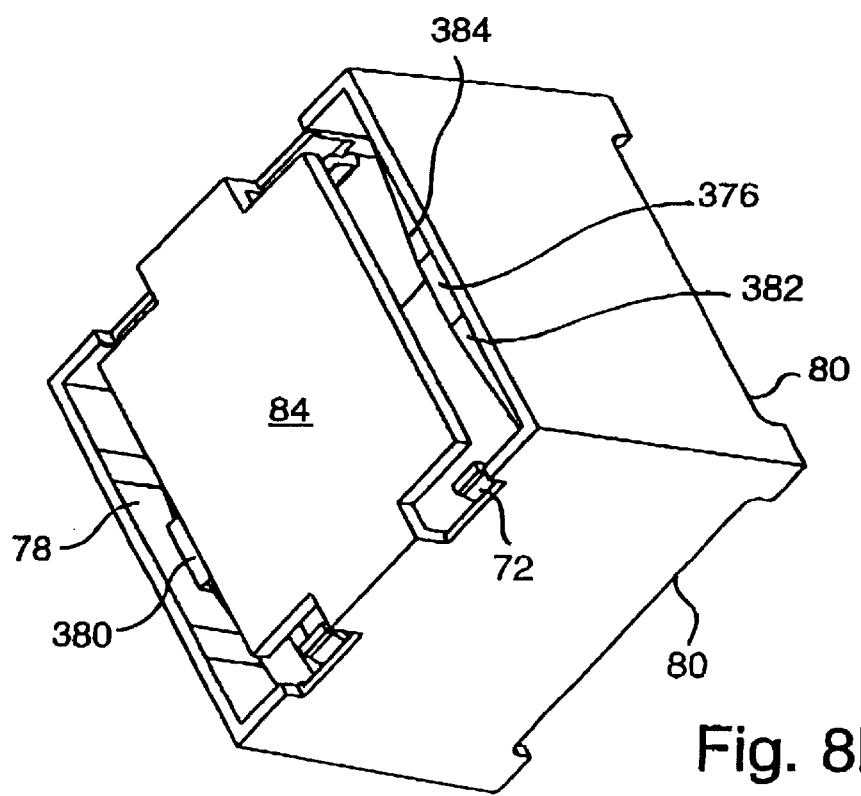

FIG. 8a and 8b show a housing with, on each side, a single, double-ended arm 376 integrally moulded at its centre 380 to a side wall of the housing. Spring arms 382 and 384 extend in opposite directions from the centre 380 and the ends of these arms are provided with depending flanges 386 which, in use, will press against the laminations stack. The top of the housing is cut-away across the top of the springs as can be seen in FIG. 8b.

Figure 9A:
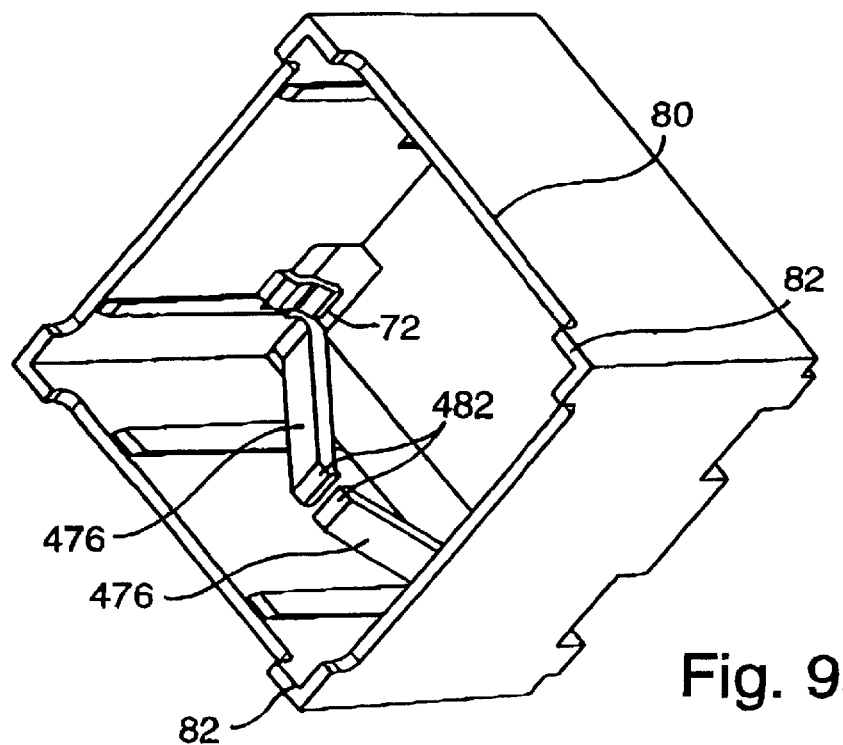
Figure 9B:
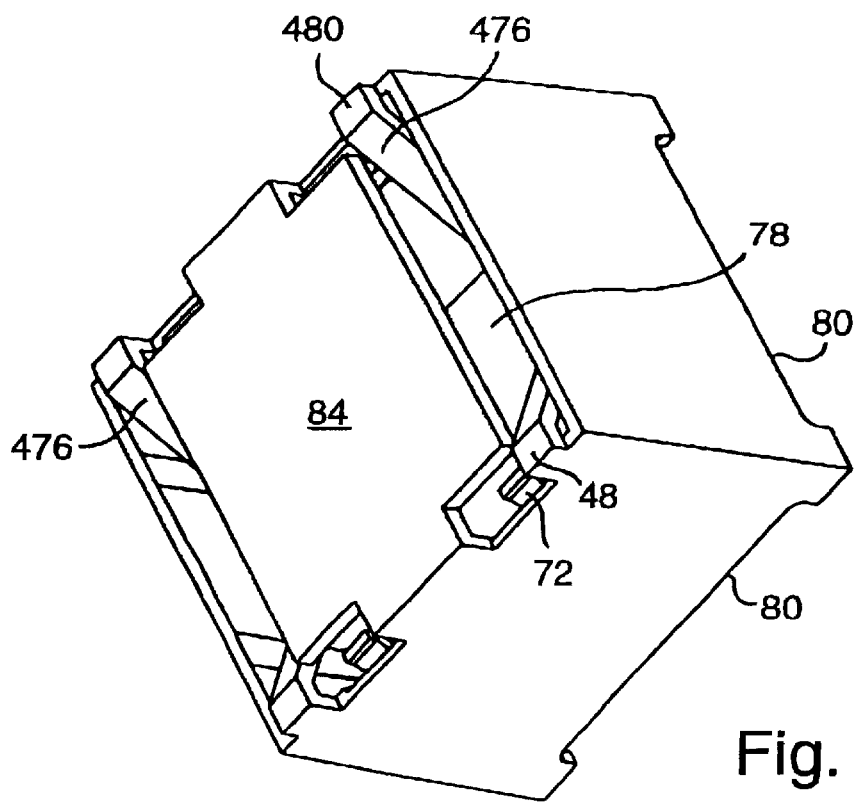

FIGS. 9a and 9b show a housing with, on each side, spring arms 476 similar to the arms 276 of FIG. 7. The difference between these two is that in FIG. 9, the arms do not cross and they exert pressure on the lamination stack through contact ends 482 at the centre of the housing, rather than at points close to the lateral walls. The top of the housing is cut-away across the top of the springs as can be seen in FIG. 9b.

Figure 10A:
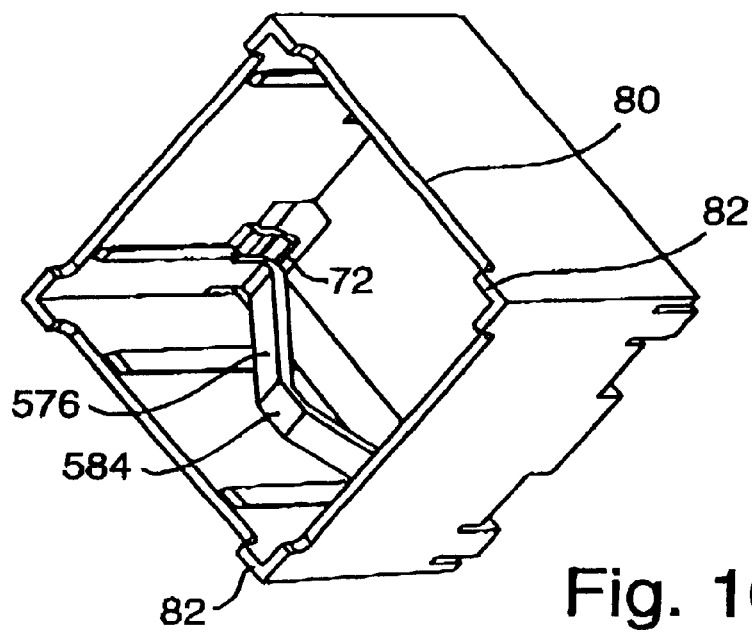
Figure 10B:
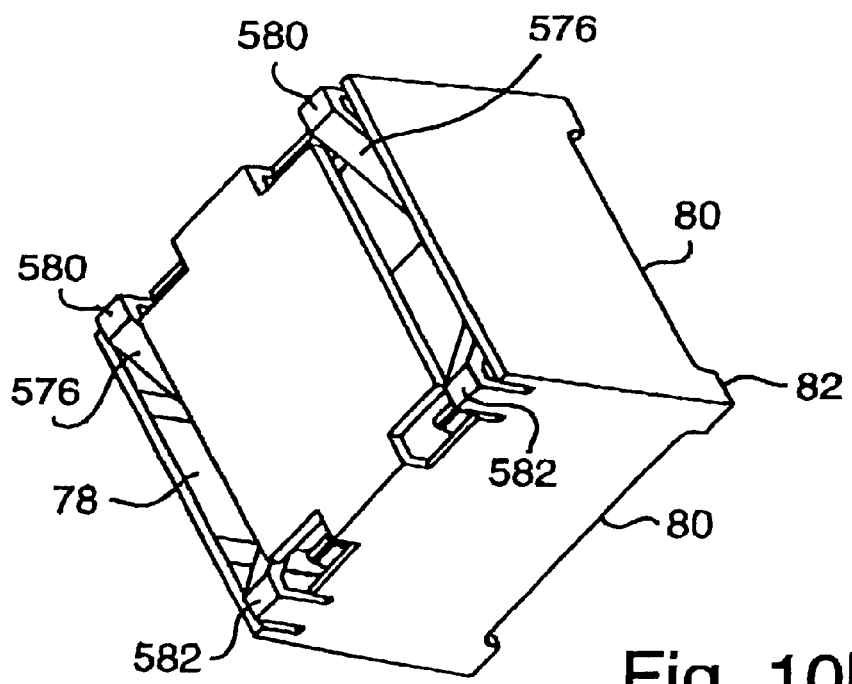

FIGS. 10a and 10b show a housing where there is a single spring arm 576 on each side, the arms each being formed by a continuous web which extends from one housing wall, at 580, to the opposite wall at 582. In the middle of the arm 576 is a contact area 584 which will exert a spring force on the lamination stack. This embodiment has the disadvantage that, as the spring arms 576 flex, they will exert an outward force on the housing walls causing some bowing of these walls. The top of the housing is cut-away across the top of the springs as can be seen in FIG. 10b.

The combination of the transformer and the box 70 thus provides many advantages, beyond those already mentioned. For example, the presence of the housing adds robustness to the components both before and after they are mounted on a PCB. Once on the PCB, contact between the feet 82 and the board reduces stress on the transformer pins when a force is applied; the flat surfaces allow vacuum handling of the components and in general allows them to be manipulated with the same equipment used for encapsulated components.

A housing as described above can also be used for housing electronic components other than transformers as described above. The housing construction described here can have more general application.

The housing will preferably have five walls (ie an open bottom through which the component can be introduced), and openings at or near the apexes of the housing.

The housing will be particularly suitable for components which are to be mounted on a printed circuit board.

What is claimed is:

1. A housing for an electronic component, the housing having a set of walls for surrounding the component, an open base through which the component can be introduced into the housing and through which component terminals can be exposed to allow the component to be mounted on a circuit board, snap-fit features past which the component can snap to retain the component in the housing and internal springs formed integrally with the housing which, in use, bias the component into contact with the snap-fit features.

2. The housing of claim 1, wherein the housing is moulded of a plastics material.

3. The housing of claim 1, the housing being generally parallelepipedic in form and has five walls, an open face through which the component can be introduced, and openings at or near the apexes of the housing.

4. The housing of claim 1 for housing a transformer having transformer laminations, wherein the springs act on the transformer laminations to press the stack of transformer laminations together whilst biasing the component into contact with the snap-fit features.

5. The housing of claim 1, wherein the housing has side walls, and at least part of the lower edge of at least part of the side walls is cut-away relative to at least other parts of the side walls, so that the parts which are not cut-away form feet which contact a substrate when the housing is in use and the cut away parts allow a fluid flow path into and out of the housing.

6. The housing of claim 1 which has apertures in its walls to allow a fluid flow path into and out of the housing.

7. The housing of claim 1, wherein the housing has a top wall, at least part of which is flat.

8. The housing of claim 1, wherein the snap-fit features are internally projecting resilient lugs.

9. A combination of an electronic component and a housing therefor, the housing having a set of walls for surrounding the component, an open base through which the component can be introduced into the housing, both the housing and the component having snap-fit features with the snap-fit features of the housing and of the component being arranged to be snap-fitted together to retain the component in the housing so that component terminals are exposed through the open base to allow the component to be mounted on a circuit board, the housing having internal springs which, in use, bias the snap-fit features into contact to prevent play between the component and the housing.

10. The combination of claim 9, wherein the housing is moulded of a plastics material, and the springs are moulded integrally with the housing.

11. The combination of claim 9, wherein the housing has openings to allow fluid to flow through the housing and past the component in the housing.

12. The combination of claim 11, wherein the component is a transformer comprising a bobbin, coils wound on the bobbin and a stack of core laminations fitted within the bobbin, and the bobbin is a plastics moulding which includes snap-fit features adapted to engage with snap-fit features in the housing, and wherein the housing springs act against the lamination stack when the transformer is fitted in the housing, to press the laminations against one another whilst also biasing the snap-fit features into contact to prevent play between the component and the housing.

13. The combination of claim 12, wherein the size and position of the openings is such as not to compromise the required creepage and clearance requirements of the transformer.

14. The combination of claim 12, wherein the thickness of the housing walls is such as not to compromise the required solid insulation requirements of the transformer.

15. The combination of claim 12, wherein the transformer laminations are stacked one on the other in the bobbin and are prevented from being displaced after assembly by the walls of the housing.

16. A transformer having a housing, a bobbin, coils wound on the bobbin and core laminations fitted on the bobbin, wherein the bobbin is a plastics moulding which includes snap-fit features adapted to engage with snap-fit features in the housing, and the housing includes integral springs which press the laminations against one another in a stack when the transformer is fitted in the housing and bias the bobbin into contact with the snap-fit features.

* * * * *